United States Patent [19]

Guigueno

[11] Patent Number: 5,617,307

[45] Date of Patent: Apr. 1, 1997

[54] ELECTRONIC VARIABLE SPEED DRIVE

[75] Inventor: Hervé Guigueno, Saint Maur des Fosses, France

[73] Assignee: Schneider Electric SA, Boulogne Billancourt, France

[21] Appl. No.: 515,003

[22] Filed: Aug. 14, 1995

[30]     Foreign Application Priority Data

Sep. 2, 1994 [FR] France .................................. 94 10564

[51] Int. Cl.$^6$ ...................................................... H02B 1/04
[52] U.S. Cl. ........................... 363/37; 361/728; 361/709; 361/734
[58] Field of Search ...................................... 361/429, 722, 361/728, 729, 730, 734, 738, 760, 782, 821, 816, 709, 703–704

[56]                    References Cited

U.S. PATENT DOCUMENTS 4,908,738  3/1990  Kobari et al. ............................ 361/429

FOREIGN PATENT DOCUMENTS 0356991   3/1990  European Pat. Off. .
0449640A1 10/1991 European Pat. Off. .
2271679   4/1994  United Kingdom .
94/14227   6/1994  WIPO .

Primary Examiner—Aditya Krishnan
Attorney, Agent, or Firm—Oblon, Spivak, McClelland, Maier & Neustadt, P.C.

[57]                    ABSTRACT

An electronic variable speed device which includes a rectifier supplied with an alternating current, at least one capacitor and an inverter supplied with a DC voltage from the rectifier to the at least one capacitor. The inverter includes plural solid state switch power modules which produce an AC voltage. A plastic material internal enclosure encloses the power modules and a heatsink is connected to the power modules. An electrical connection board electrically connects the power modules to the at least one capacitor such that the heatsink, power modules, at least one capacitor and electrical connection board form a non-sealed chamber containing the power modules. An electronic control system is connected to the electrical connection board to control the power modules.

3 Claims, 2 Drawing Sheets

ELECTRONIC VARIABLE SPEED DRIVE

BACKGROUND OF THE INVENTION

1. Field of the Invention

The present invention concerns an electronic variable speed drive including, in a casing, a rectifier supplied with alternating current and associated with capacitors to provide a direct current supply to an inverter comprising a plurality of solid state switch power modules controlled by an electronic control system and supplying an AC voltage.

1. Discussion of the Background

Electronic variable speed drives are routinely used to drive direct current motors and alternating current motors at variable speed.

Frequency converter type variable speed drives derive from the single-phase or three-phase AC mains an AC voltage with a root means square value and frequency that vary according to a predefined law in order to control the speed of alternating current motors. These frequency converters essentially comprise a rectifier associated with a smoothing capacitor filter to supply a filtered DC voltage to an inverter. The rectifier is a rectifier bridge connected to the single-phase or three-phase AC mains. The inverter supplies a variable frequency AC voltage at its output. The inverter includes solid-state switches called power modules and is connected to the phase windings of the motor. It produces an AC voltage from the DC voltage supplied by the rectifier.

The solid-state power switches are controlled by control electronics. One well-known control technique is pulse width modulation (PWM). Its objective is to generate a voltage as close as possible to a sinusoid.

For optimum ventilation of the variable speed drive the casing incorporates a plurality of openings. In the event of a short-circuit, flames around the power modules cause short-circuits to the earthed metal parts.

SUMMARY OF THE INVENTION

An object of the present invention is to provide power module protection capable of preventing the propagation of flames in the event of an incident affecting one or more power modules. This protection of the power modules does not alter the compact size of the variable speed drive.

The electronic variable speed drive of the invention is characterized in that the power modules are housed in a plastics material internal enclosure cooperating with an electrical connection board electrically connecting the modules and the capacitors and with a heatsink to constitute a non-sealed chamber containing the power modules.

According to one feature of the invention the enclosure is an open-ended box-section between the electrical connection board and the heatsink.

DESCRIPTION OF THE DRAWINGS

The invention will now be described in more detail with reference to one embodiment shown by way of example in the appended drawings, in which.

DESCRIPTION OF THE PREFERRED EMBODIMENTS

Figure 1:
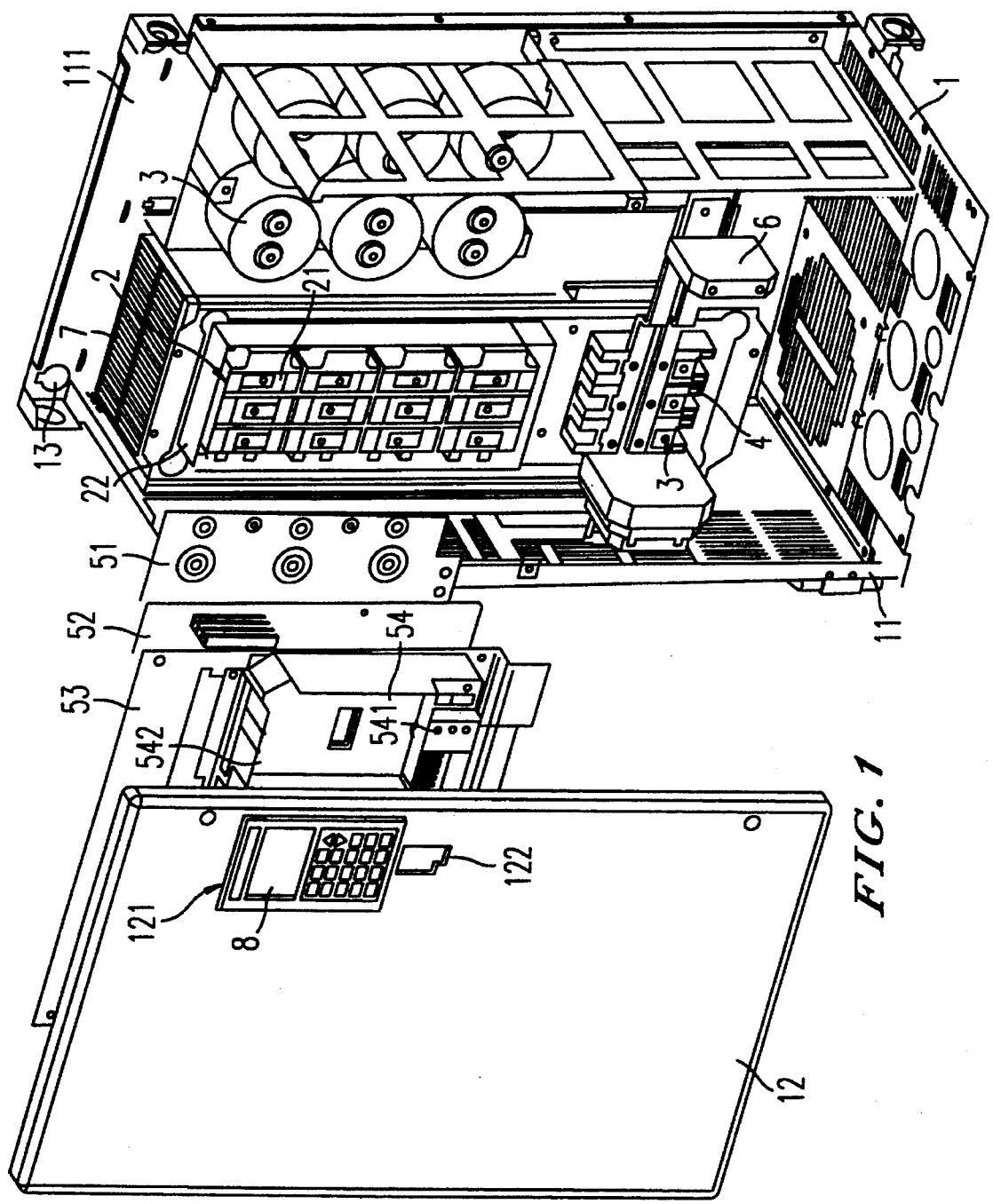
FIG. 1 is an exploded perspective view of an electronic variable speed drive of the invention with the lefthand side panel and the mop panel removed.
Figure 2:
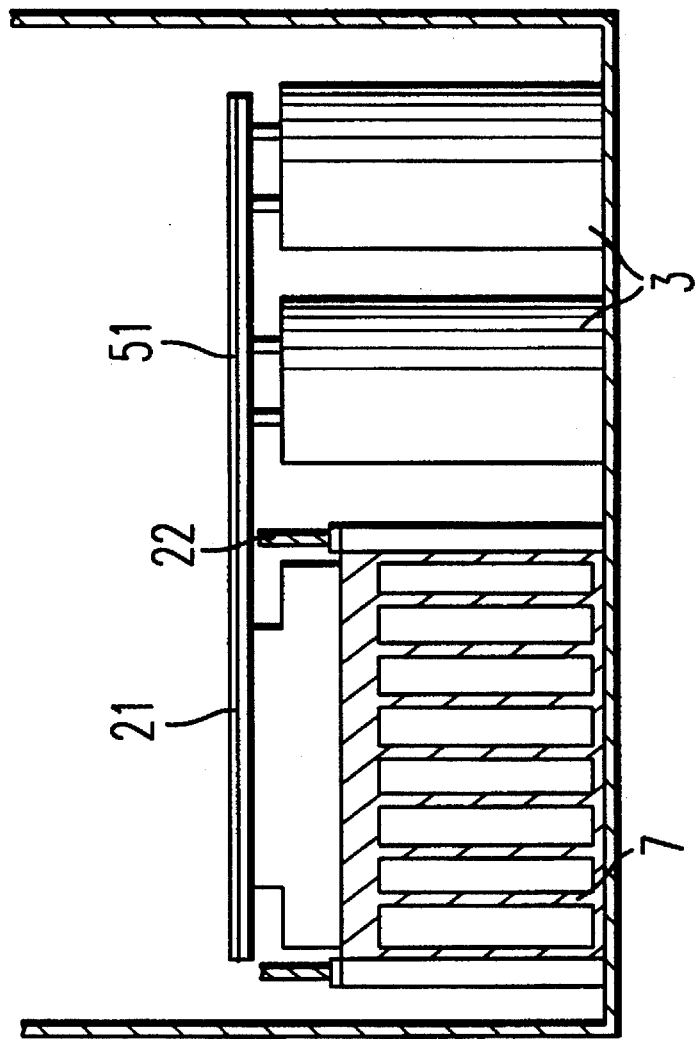
FIG. 2 is a sectional view of the power module housing.

The electronic variable speed drive shown in the drawings is a frequency converter suitable for an asynchronous motor.

The electronic variable speed drive has a casing 1 in the form of a casing body 11 and a lid 12 pivoted to the casing body by hinges at the sides. When closed the lid locks to the casing body.

A terminal block 6 inside the casing connects the variable speed drive input to the AC mains and connects the inverter output to the motor.

The casing 11 has a metal backplate 111 with fixing lugs 13 on the back for attaching the variable speed drive to a support. Ventilation holes are provided in the side panels of the casing. The bottom panel of the casing incorporates a cable gland plate through which cables are lead into and out from the terminal block 6.

The casing 1 contains the filter diode rectifier 4, the capacitors 3 and the inverter 2. The inverter 2 is connected by the filter capacitors 3 to the diode rectifier 4 which is connected via the terminal block 6 to the phase conductors of the three-phase AC mains. Each arm of the inverter 2 has two solid-state power switches with associated recovery diodes. These sets of components constitute the power modules 21. The mid-points of the switch pairs are connected by terminals of the terminal block 6 to the phase windings of the motor.

The solid-state switches are bipolar MOS components such as IGBT or GTO thyristors or other like switch devices.

The power modules 21 are mounted on a heatsink 7 to cool the solid state power switches. The heatsink 7 has air passages at the rear. Air is moved through the heatsink 7 by a fan (not shown) and is then evacuated to the exterior through the ventilation openings in the top panel of the casing.

An electrical connection board 51 is mounted in front of the power modules 21 and the capacitors 3 to connect them electrically. The conductive board 51, the design of which is known in itself, is made up of flat metal conductors insulated from each other and externally insulated by a plastics material covering.

In front of the electrical connection board 51 is a power board 52 and a support plate 53 supporting a plastics material control receptacle 54.

The power board 52 carries all of the control electronics near the solid-state switches.

The control receptacle 54 conceals the electronic control circuits and protects the operator against electrical shock when the lid 12 is open. It carries indicator means 541 visible through a window 122 in the lid 12. It incorporates a compartment with a continuous rim 542 which receives the dialogue console 8 and seals to the surround of the window 121. The control receptacle provides access to connectors (additional board, dialogue console, PCMCIA card, etc) and has openings for connectors to pass through. When the lid 12 is open, the protection receptacle 54 and the plate 53 close off most of the casing body.

The terminal block 6 remains accessible under the plate 53 but is made up of protected terminals, so the system as a whole is protected.

The variable speed drive parameters can be set using the dialogue console 8 which is of the graphics type and is flush in the window 121 in the lid 12.

The power modules 22 are housed in a plastics material internal enclosure 22 which constitutes an annular openended box-section around them. This open-ended box-section 22 is disposed between the conductive board 51 and the heatsink 7. The perimeter of the openended box-section, which has a rectangular cross-section, is relatively close to that of the modules and does not project beyond the heatsink. The open-ended box-section is fixed by means of the plate 53.

Variants and improvements of detail, and even the use of equivalent means, are feasible without departing from the scope of the invention.

The device just described can be used in any electronic variable speed drive.

I claim:

1. An electronic variable speed drive apparatus comprising:

a rectifier supplied with an alternating current;

at least one capacitor;

an inverter supplied with a DC voltage from the rectifier through the at least one capacitor, the inverter including a plurality of solid state switch power modules producing an AC voltage;

a plastic material internal enclosure enclosing the power modules of the inverter;

a heatsink connected to the power modules of the inverter;

an electrical connection board electrically connecting the power modules of the inverter to the at least one capacitor such that the heatsink, power modules of the inverter, at least one capacitor and electrical connection board form a non-sealed chamber containing the power modules of the inverter;

an electronic control system connected to the electrical connection board to control the power modules of the inverter.

2. The electronic variable speed drive apparatus according to claim 1, wherein the plastic material internal enclosure is an open-end box-section disposed between the electrical connection board and the heatsink.

3. The electronic variable speed drive apparatus according to claim 1, further comprising a casing for containing the rectifier, at least one capacitor, inverter, plastic material internal enclosure, heatsink, electrical connection board and electronic control system.

\* \* \* \* \*